United States Patent
Yang et al.

(10) Patent No.: US 10,734,277 B2
(45) Date of Patent: Aug. 4, 2020

(54) TOP VIA BACK END OF THE LINE INTERCONNECT INTEGRATION

(71) Applicant: International Business Machines Corporation, Armonk, NY (US)

(72) Inventors: Chih-Chao Yang, Glenmont, NY (US); Lawrence A. Clevenger, Saratoga Springs, NY (US); Benjamin D. Briggs, Waterford, NY (US); Brent Anderson, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 37 days.

(21) Appl. No.: 16/194,545

(22) Filed: Nov. 19, 2018

(65) Prior Publication Data
US 2020/0161175 A1    May 21, 2020

(51) Int. Cl.
*H01L 21/768* (2006.01)

(52) U.S. Cl.
CPC .... *H01L 21/76831* (2013.01); *H01L 21/7682* (2013.01); *H01L 21/76802* (2013.01); *H01L 21/76822* (2013.01); *H01L 21/76837* (2013.01); *H01L 21/76897* (2013.01)

(58) Field of Classification Search
CPC ......... H01L 21/76831; H01L 21/76822; H01L 21/76802; H01L 21/7682; H01L 21/76897; H01L 21/76837
See application file for complete search history.

(56) References Cited

U.S. PATENT DOCUMENTS

| | | | |
|---|---|---|---|
| 5,891,513 A | 4/1999 | Dubin et al. | |
| 6,143,645 A | 11/2000 | Hsu et al. | |
| 6,259,160 B1 * | 7/2001 | Lopatin | H01L 21/76801 257/750 |
| 6,544,871 B1 * | 4/2003 | Honeycutt | H01L 21/76843 257/E21.589 |
| 7,086,138 B2 | 8/2006 | Anderson | |
| 7,727,888 B2 | 6/2010 | Yang et al. | |
| 8,299,625 B2 | 10/2012 | Ponoth et al. | |
| 8,987,134 B2 | 3/2015 | Wang et al. | |
| 9,576,893 B2 * | 2/2017 | Huang | H01L 21/7682 |
| 9,799,560 B2 | 10/2017 | Song et al. | |
| 2002/0121699 A1 | 9/2002 | Cheng et al. | |
| 2014/0264908 A1 * | 9/2014 | Lee | H01L 23/49827 257/774 |

OTHER PUBLICATIONS

Briggs, B., et al., "Fully Aligned Via Integration for Extendibility of Interconnects to Beyond the 7nm Node," 2017 IEEE, 4 pages.
Liebmann, L. et al., "Pre-PDK block-level PPAC assessment of technology options for sub-7nm high performance logic," Proc. of SPIE, vol. 10588, downloaded from: https://www.spiedigitallibrary.org/conference-proceedings-of-spie on Jul. 18, 2018, 11 pages.

* cited by examiner

*Primary Examiner* — Selim U Ahmed
(74) *Attorney, Agent, or Firm* — Cantor Colburn LLP; Vazken Alexanian

(57) ABSTRACT

Back end of line metallization structures and processes of fabricating the metallization structures generally include a top via integration scheme. The top via integration scheme integrally forms the via on top of trench. Thus, the via is fully aligned and can be of a desired critical dimension.

13 Claims, 8 Drawing Sheets

US 10,734,277 B2

TOP VIA BACK END OF THE LINE INTERCONNECT INTEGRATION

BACKGROUND

The present invention generally relates to semiconductor integrated circuits, and more particularly, to the structure and top via back end of the line interconnect integration.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact formation. Layers of interconnections are formed above these logical and functional layers during the BEOL processing to complete the integrated circuit structure. As such, BEOL processing generally involves the formation of insulators and conductive wiring.

SUMMARY

Embodiments of the present invention are generally directed to semiconductor structures including a back end of line metallization structure. The back end of the line structure in one or more aspects of the present invention includes an Mx metallization level, an Mx+1 metallization level and a Vx metallization intermediate the Mx and Mx+1 metallization levels. The Mx metallization includes a metal filled line embedded in an interlayer dielectric, wherein x is an integer greater than or equal to 1. The Mx+1 metallization level also includes a metal filled line embedded in an interlayer dielectric. The Vx+1 metallization level includes a metal filled via embedded in an interlayer dielectric, wherein the Vx+1 metallization level is self-aligned to the metal filled lines in the Mx metallization level.

A non-limiting example of a back end of the line process for forming an interconnect structure according to one or more aspects of the present invention includes depositing a first interlayer dielectric layer onto a substrate. The first interlayer dielectric is lithographically patterned and etched to form one or more trench openings. A first liner layer is conformally deposited onto the substrate. A metal is deposited into the one or more openings and forms an overburden of the metal having a defined thickness. A hard mask layer is deposited onto the top surface of the overburden and patterned to the overburden. Exposed portions of the overburden are directionally etched to the interlayer dielectric. The hard mask layer is removed so as to form a pillar of the metal onto the metal filled trench, wherein the pillar defines a via self-aligned to the metal filled trench and at a thickness of about the defined thickness of the overburden. A second liner layer is conformally deposited onto the exposed surfaces of the pillar and exposed portions of the metal filled trench such that the metal filled trench and via are encapsulated.

A non-limiting example of a back end of the line process for forming an interconnect structure according to one or more aspects of the present invention includes depositing a first interlayer dielectric layer onto a substrate. The interlayer dielectric is lithographically patterned and etched to form one or more trench openings. A first liner layer is conformally deposited thereon. A metal is deposited into the one or more trench openings to form metal filled trenches and form an overburden of the metal thereon. The overburden is removed by planarization to the first liner layer. A hard mask layer is deposited onto the substrate and patterned. Exposed portions of the substrate are directionally etched to define a self-aligned via on top of at least one of the metal filled trenches. The hard mask layer is removed and a second liner layer is conformally deposited onto the exposed surfaces of the pillar and exposed portions of the metal filled trenches.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Prior Art

Prior Art

DETAILED DESCRIPTION

Figure 1:
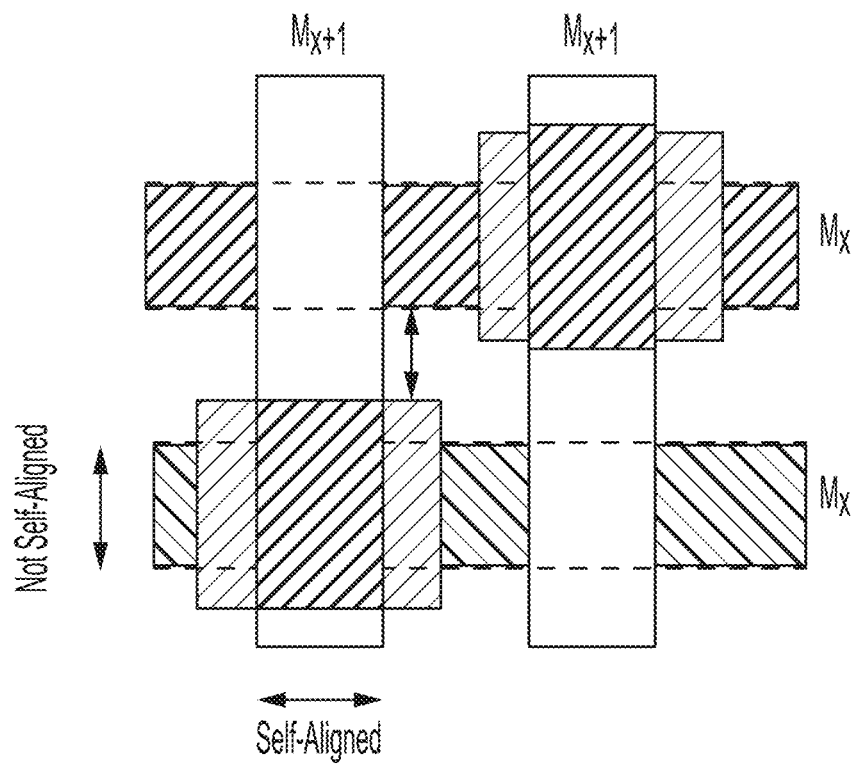
FIG. 1 depicts a top down view of metallization levels including an Mx line metallization level, an Mx+1 line metallization level and a Vx via metallization level intermediate the Mx and Mx+1 metallization levels, wherein the Vx via metallization level is self-aligned in the orthogonal Vx to Mx+1 direction but not in the parallel direction.

As scaling of back end of line (BEOL) dimensions in advanced nodes continues below 36 nanometer (nm) pitch, the proportion of critical dimension (CD) and overlay variations enters a regime of significant compromise, especially with respect to minimum insulator spacing rules. The conventional trench-first metal hardmask self-aligned via (SAV) scheme introduced at the 32 nm node helped to mitigate the orthogonal Vx to Mx+1 spacing, wherein V represents a vis level and M represents a metal line level and x is a whole integer. However, the SAV scheme does not address the parallel (non-SAV) Vx alignment to Mx below. As shown schematically in top down view of prior art FIG. 1, metallization levels including an Mx line metallization level, an Mx+1 line metallization level and a Vx via metallization level intermediate the Mx and Mx+1 metallization levels are depicted. The conventional trench-first metal hardmask self-aligned via (SAV) scheme provides self-alignment of the Vx via metallization level in the orthogonal Vx to Mx+1 direction but not in the parallel direction.

Figure 2:
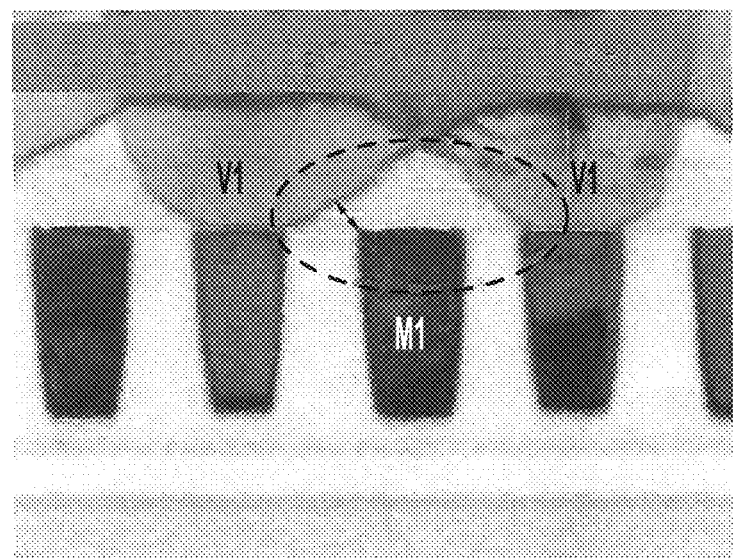
FIG. 2 depicts a photomicrographic cross section of integrated circuit illustrating the lack of critical dimension control associated with forming the Vx metallization level and chamfer control inherent to the non-self-aligned via edge.

A lack of CD and chamfer control inherent to the non-SAV edge combined with edge placement error to the top of neighboring Mx has become a technology limiter for Vx-Mx spacing, in turn requiring narrower lines and reduced via contact area, which is evident in prior art FIG. 2. The uncontrolled via chamfer increases the risk of V1 to M1 shorting, which can result in poor electrical yield and low reliability. The dotted circular region clearly shows the extent of via chamfer and the resulting proximity of the via (Vx) to metal line (Mx).

Chamfer-less via schemes can help control CD growth during trench reactive ion etch (ME) to help nominal via-line spacing. However, these schemes do not address via contact area overlay variations, which dominate at metal pitches below 36 nm. To continue BEOL scaling beyond the 7 nm technology node, integration schemes must be developed to fully develop vias both to wires above and below.

In the present invention, a top via integration scheme forms the via (Vx) on top of trench (Mx) as opposed to the via (Vx) being formed at the bottom of the trench (Mx+1) as in a typical dual damascene process. The top via integration scheme enables the use of ultra-low k materials in the BEOL process, provides increased conductor area, provides greater than a 50% decrease in RC, and provides about a 40% field programmable gate array (FPG) improvement, among other advantages.

Detailed embodiments of the integrated circuit including at least one top via integration scheme aligned in both the orthogonal and parallel directions and methods for fabricating the multiple levels of interconnect structures according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "about," "substantially," and equivalents thereof modifying the quantity of an ingredient, component, or reactant of the invention employed, or modifying any other quantity or dimension, refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

FIGS. 3-10 schematically illustrate cross sectional views of a BEOL metallization structure and process flow for forming the back end of line metallization structure for an integrated circuit in accordance with one or more aspects of the present invention. The structure and method utilizes a top via integration scheme to provide alignment in both the orthogonal and parallel directions of the Mx and Mx+1 features.

Figure 3:
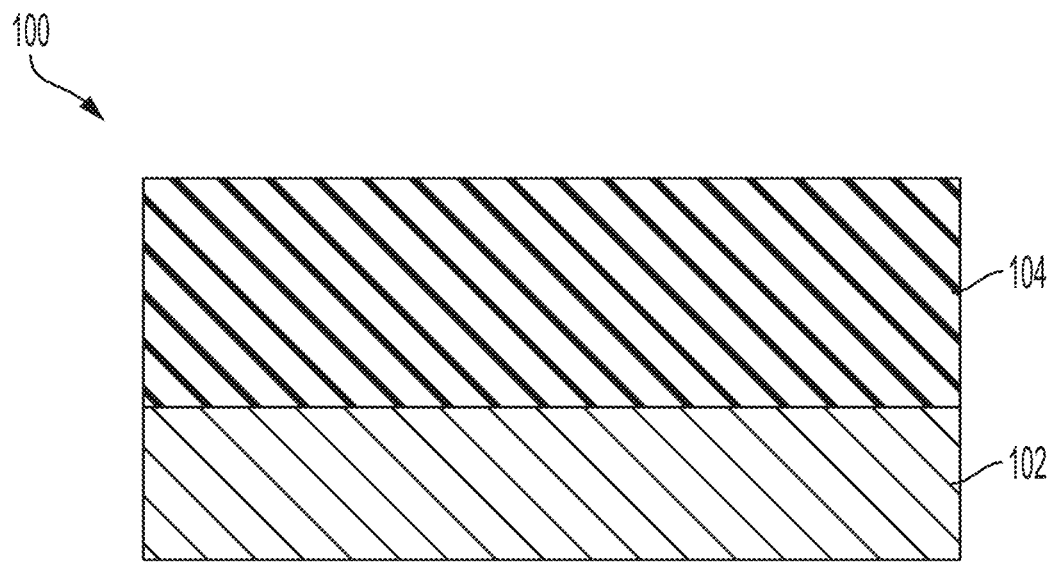
FIG. 3 depicts a cross section of intermediate back end of line structure in accordance with one or more embodiments of the present invention.

In FIG. 3, there is shown a portion of an integrated circuit 100 including a substrate 102 and an interlayer dielectric 104.

The substrate 102 is not intended to be limited and can represent front end of line (FEOL) components. FEOL generally refers to the construction of the components of the IC directly inside the wafer. A mono-crystal silicon wafer can be polished in order to obtain a substrate with its surface as regular and flat as possible. The top of the wafer is then prepared for photolithography by covering it with an insulating layer to serve as a mask, typically an oxide and a subsequent covering film of protective material which is sensitive to light, called photoresist. A photomask with the circuit pattern for one layer of the chip is loaded and aligned with the wafer. The exposure process of the wafer to activating radiation through the mask allows to remove the exposed photoresist area. The unprotected insulating material is then striped away using a chemical etching process and the remaining photoresist is removed by a developer solution. In general, there are two types of photoresist: negative and positive. When exposed to UV light, the negative photoresist becomes polymerized and more difficult to dissolve in developer solution than the positive resist. For negative resist, the developer solution removes only the unexposed areas. In this way, it is possible to create a pattern of non-protected silicon wafer areas surrounded by regions of non-conducting material. Then, the modification of the electrical properties of the exposed areas involves doping processes, such as ion implantation which is used to create sources and drains of a transistor, for example. Other conducting or insulating layers can also be added. A new layer of material is then added and the entire photolithography process, which includes imaging, deposition, etching, and doping, is repeated to create many different components of the chip, layer by layer.

The interlayer dielectric 104 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer 104 can be deposited by PECVD procedures as is generally known in the art. Typically, the dielectric layer is silicon dioxide.

In one or more embodiments, the interlayer dielectric 104 can be an ultra-low k (ULK) dielectric. The ULK dielectric can have a dielectric constant of up to about 3, meaning a dielectric constant of greater than zero up to about 3, such as a dielectric constant ranging from about 1.5 to about 3.0, and in one or more embodiments, can have a dielectric constant of less than about 2.5. The ULK dielectric typically contains pores having characteristic dimensions ranging from about 0.5 nanometers to about 10 nanometers, such as from about 0.5 nanometers to about 2 nanometers.

Exemplary ULK dielectrics can include porous inorganic materials such as, for example, silicon-containing materials such as compositions of Si, C, O, and H, including (SiCOH), also called C doped oxide (CDO) or organosilicate glass (OSG). The ULK dielectrics deposited by plasma enhanced chemical vapor deposition (PECVD), or by spin coating methods. Specific examples of PECVD ULK dielectrics include, but are not limited to, Black Diamond porous SiCOH (BDII, BDIII) from Applied Materials, and ULK or ELK Aurora from ASM.

A variety of spin applied films having the composition Si, C, O, H, such as, methylsilsesquioxanes, siloxanes can also be used. The materials known as Orion and other materials from Trikon and the material known as Zircon from Shipley can also be used.

In one or more embodiments, the ULK dielectric can be a porous low-k organic material such as the commercially available porous organic thermoset from Dow Chemical Co. sold under the tradename porous SiLK, or polyarylene ethers, and the like.

Figure 4:
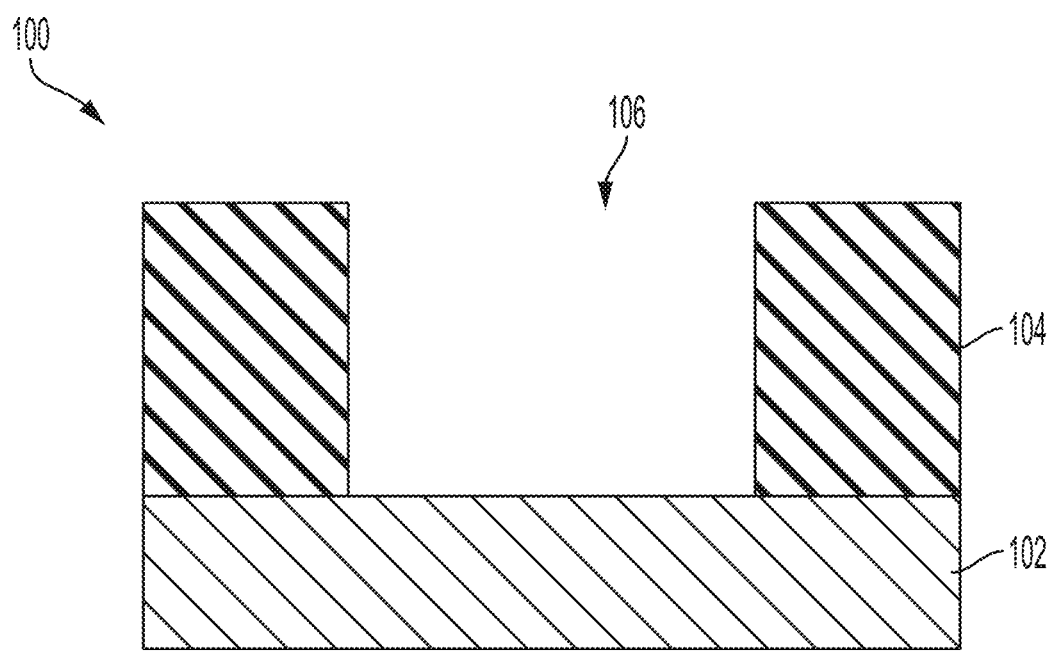
FIG. 4 depicts a cross section of the structure of FIG. 3 subsequent to patterning and etching an interlayer dielectric to form one or more openings in accordance with one or more embodiments of the present invention.

Turning now to FIG. 4, the interlayer dielectric 104 is lithographically patterned and etched to form one or more openings including a trench feature 106.

Figure 5:
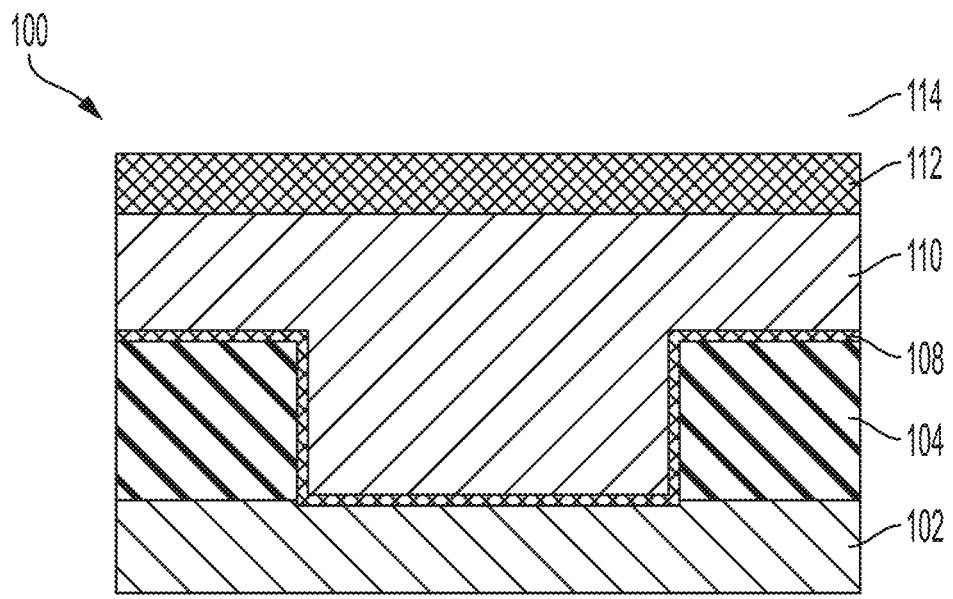
FIG. 5 depicts a cross section of the structure of FIG. 4 subsequent to deposition of a metal conductor in the opening and formation of an overburden thereon followed by deposition a metal hard mask and a dielectric hard mask in accordance with one or more embodiments of the present invention.

In FIG. 5, a liner layer 108 (i.e., diffusion barrier layer) (not shown) can be conformally deposited onto the patterned dielectric layer 104 prior to filling the trench opening 106 with a metal. A typical liner layer can include tantalum, tantalum nitride, cobalt, ruthenium, titanium, titanium nitride, tungsten nitride, or combinations of more than one material (for example tantalum nitride/tantalum or tantalum nitride/cobalt). The presence of the liner layer such as titanium nitride, for example, insures that a metal such as copper, which can participate in interdiffusion during subsequent annealing processes, to fabricate the integrated circuit 100 will not further diffuse into interlayer dielectric. The liner layer can be deposited by PVD, CVD, or ALD processes.

Next, an optional conformal seed layer (not shown) is deposited. The function of the seed layer is to provide an adhesive base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of metal is then deposited, which will be used to define the metal filled trench 106 along with an overburden. The metal can be copper, but can be any suitable conductor including, but not limited to Co, Al, AlCu, Ti, TiN, Ta, TaN, W, WN, Mo, MoN, Pt, Pd, Os, Ru, Ir, $IrO_2$, Re, $ReO_2$, $ReO_3$, Rh, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 atomic weight percent (wt. %) to about 10 atomic wt %).

The metal layer can be formed by CVD, sputtering, electrochemical deposition or like processes. For example, the deposition of copper can proceed by electrochemical deposition such as electroplating or electroless plating.

Following formation of the metal layer 110, the substrate is typically subjected to a planarization process to planarize the top surface of overburden. By way of example, the surface can be planarized using an electropolishing process. In an electropolishing process, small amounts of metal overburden are etched by electroetch or electrochemical etching to provide a metal interconnect having a top metal surface generally coplanar to the top surface of the dielectric. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process. The remaining overburden is at a thickness effective to form a via structure from the overburden on the metal filled trench.

A metal hard mask layer 112 is deposited onto the planarized overburden layer. By way of example, the metal hard mask 112 can be titanium nitride, tantalum nitride, or the like. A dielectric material hard mask layer 114, for instance, a TEOS, SiON, SiCN, or more generally, any conventional dielectric material having the desired etch-selectivity is deposited onto the metal hard mask layer 112.

Figure 6:
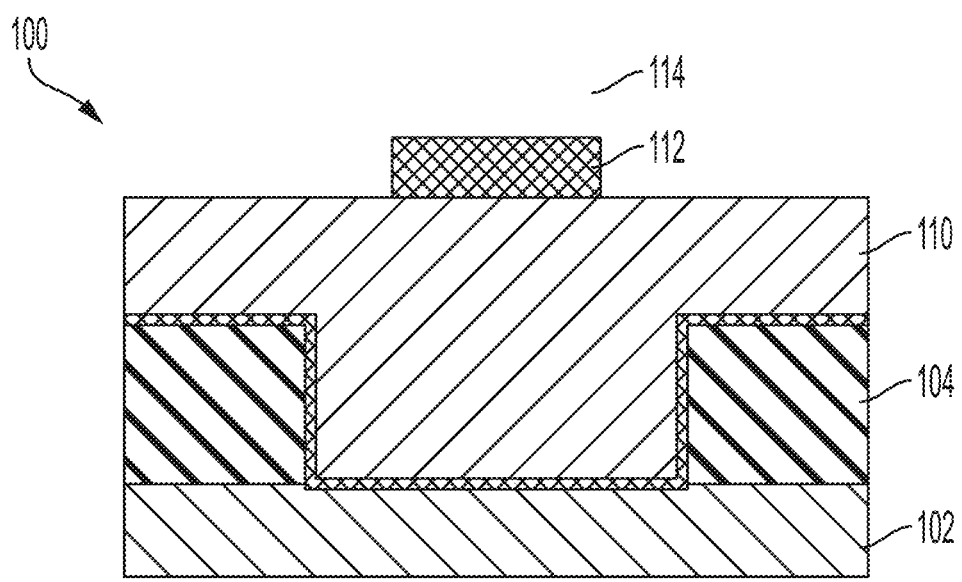
FIG. 6 depicts a cross section of the structure of FIG. 5 subsequent to patterning the hard mask layers in accordance with one or more embodiments of the present invention.

Referring now to FIG. 6, hard mask layers 112, 114 are lithographically patterned and etched to the overburden layer 110.

Figure 7:
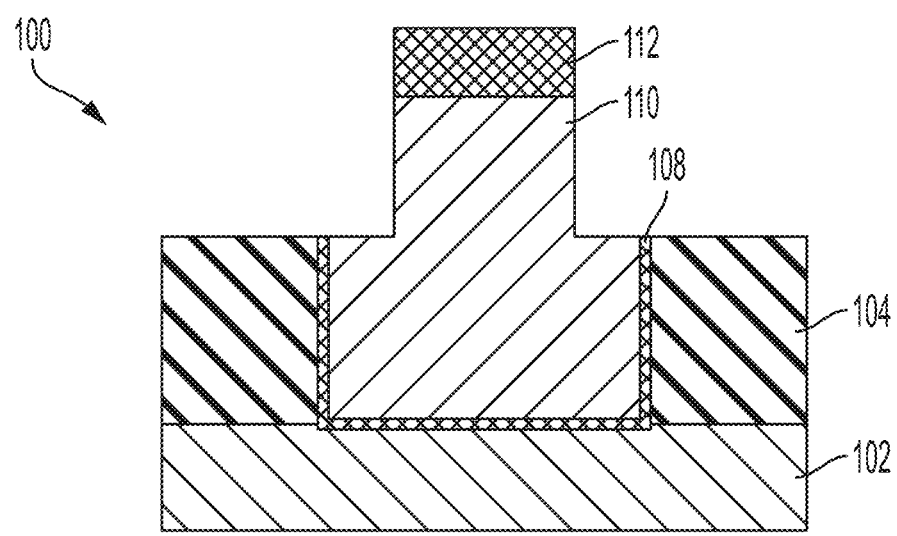
FIG. 7 depicts a cross section of the structure of FIG. 6 subsequent to directional etching the exposed portions of the overburden to the dielectric layer in accordance with one or more embodiments of the present invention.

In FIG. 7, the substrate is subjected to a directional etch process such as ion beam bombardment, chemical etch, reactive ion etch or combinations thereof to selectively remove the exposed overburden 110 to the interlayer dielectric 104. The metal hard mask layer 112 is then removed using a wet etch process, for example, in the case of titanium nitride removal. The resulting metal structure includes a metal filled trench 116 and a pillar 118 thereon, which is used to define the via. The via, i.e., pillar, can be configured with substantially vertical sidewalls (i.e., chamferless).

Figure 8:
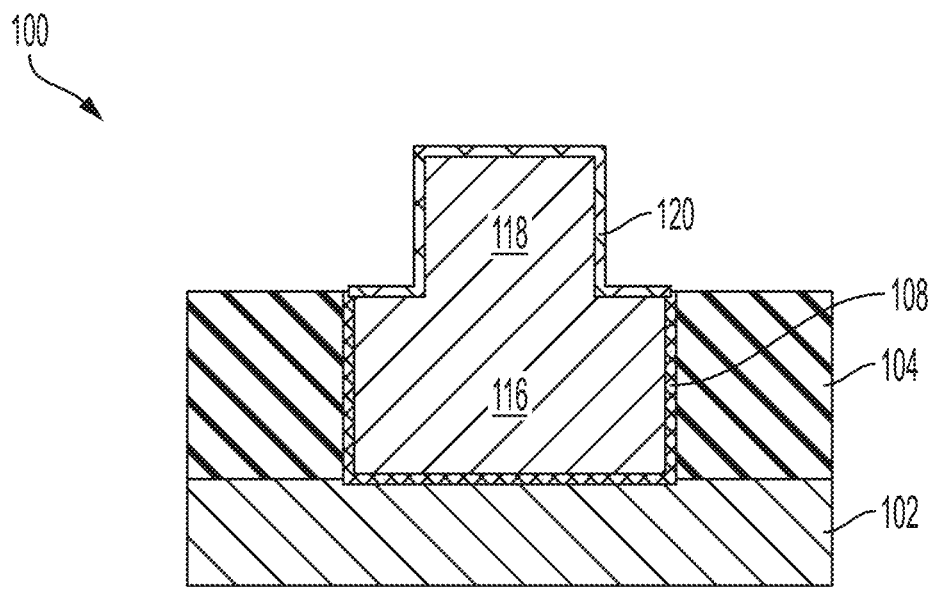
FIG. 8 depicts a cross section of the structure of FIG. 7 subsequent to conformal deposition of a liner layer onto the exposed surfaces of the metal conductor in accordance with one or more embodiments of the present invention.

In FIG. 8, a liner layer 120 is selectively and conformally deposited onto the exposed surfaces of the via 118 and the trench 116. The liner layer 120 can be formed of a conductive barrier layer such as cobalt, ruthenium, tantalum nitride, tungsten, or the like.

Figure 9:
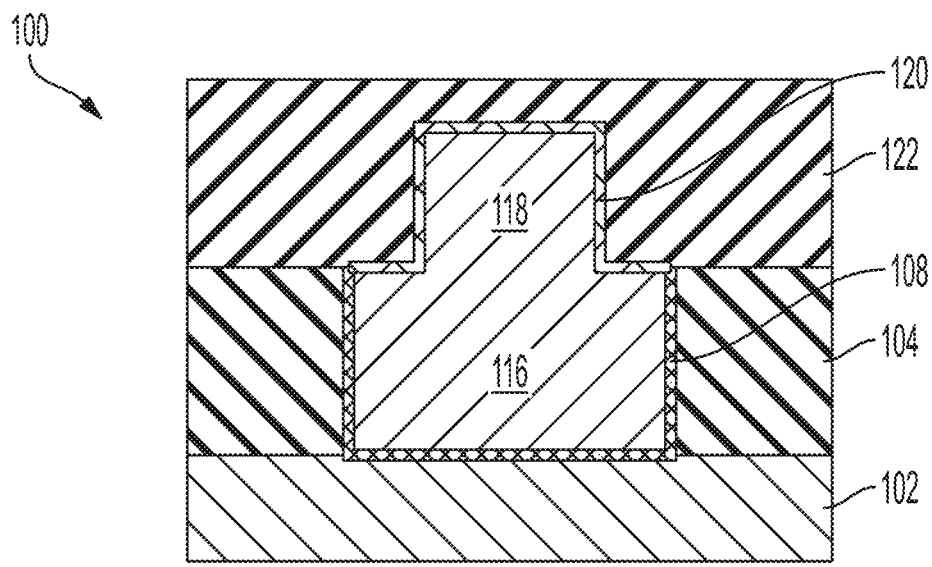
FIG. 9 depicts a cross section of the structure of FIG. 8 subsequent to deposition of an interlayer dielectric in accordance with one or more embodiments of the present invention.

In FIG. 9, an interlayer dielectric 122 is deposited onto the structure 100. The interlayer dielectric can be the same or different from interlayer dielectric 104.

Figure 10:
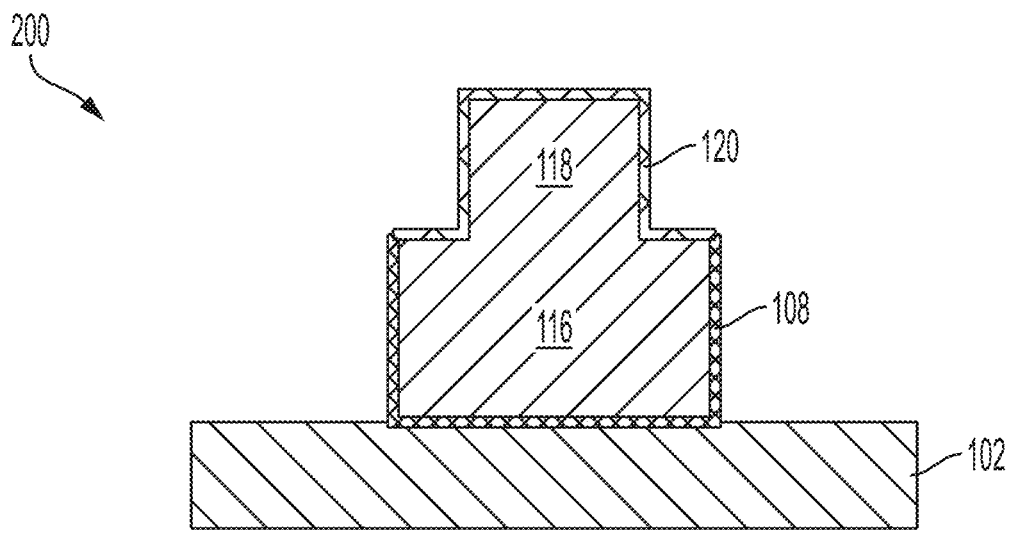
FIG. 10 depicts a cross section of the structure of FIG. 8 subsequent to removal of the interlayer dielectric in accordance in accordance with one or more embodiments of the present invention.
Figure 11:
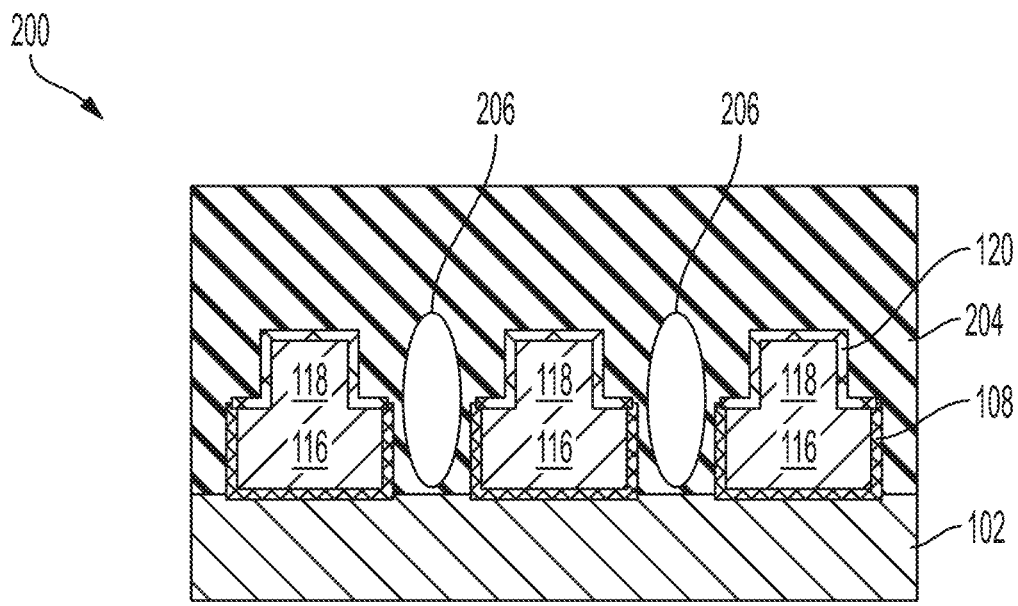
FIG. 11 depicts a cross section of the structure of FIG. 10 subsequent to deposition of an interlayer dielectric and formation of air gaps between adjacent metal filled top via and trench structures in accordance with one or more embodiments of the present invention.

FIGS. 10-11 depict an alternative embodiment subsequent to removal of interlayer dielectric 104 from the structure depicted in FIG. 9. As shown in FIG. 10, the structure includes the trench 116 and top via 118 as shown subsequent to removal of the interlayer dielectric and is encapsulated with liner layer 108 and 120. In FIG. 11, an interlayer dielectric 204 is deposited and configured to pinch off during deposition thereof so as to form air gaps between adjacent interconnect structures.

Figure 12:
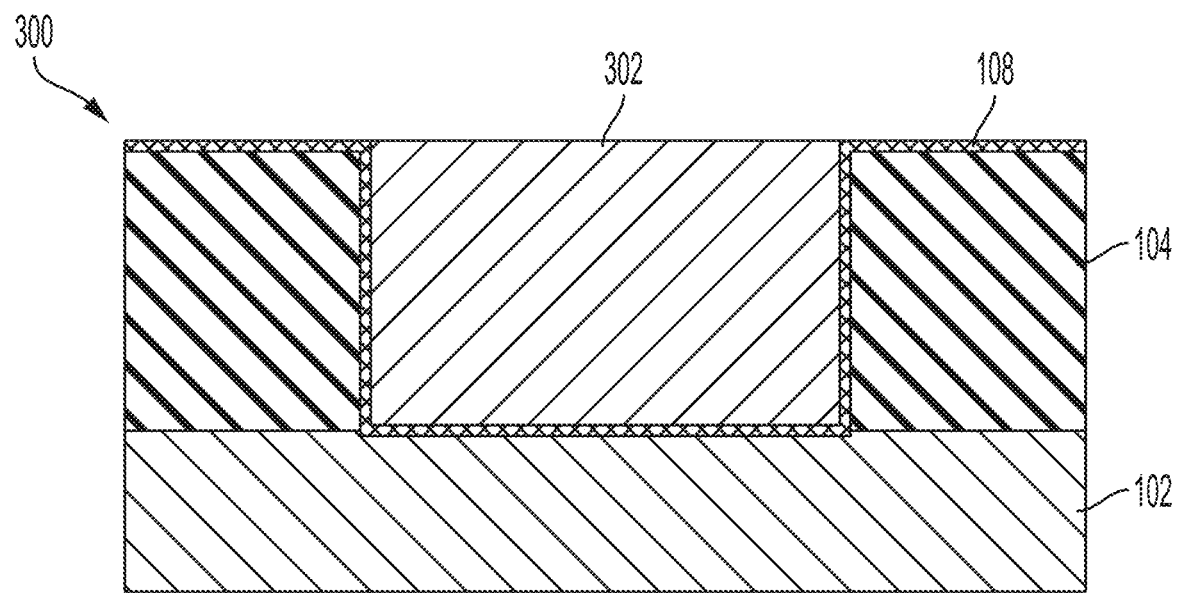
FIG. 12 depicts a cross section of the structure of FIG. 5 prior to deposition of a hard mask layer thereon and subsequent to removal of the overburden to form metal filled trenches in accordance with one or more embodiments of the present invention.

FIG. 12 illustrates a sectional view of the structure of FIG. 5 prior to deposition of the hard mask layers and subsequent to planarization to remove the overburden and form a structure 300 including a metal filled trench 302, i.e., line embedded within the interlayer dielectric. Planarization stops at the liner layer 108.

Figure 13:
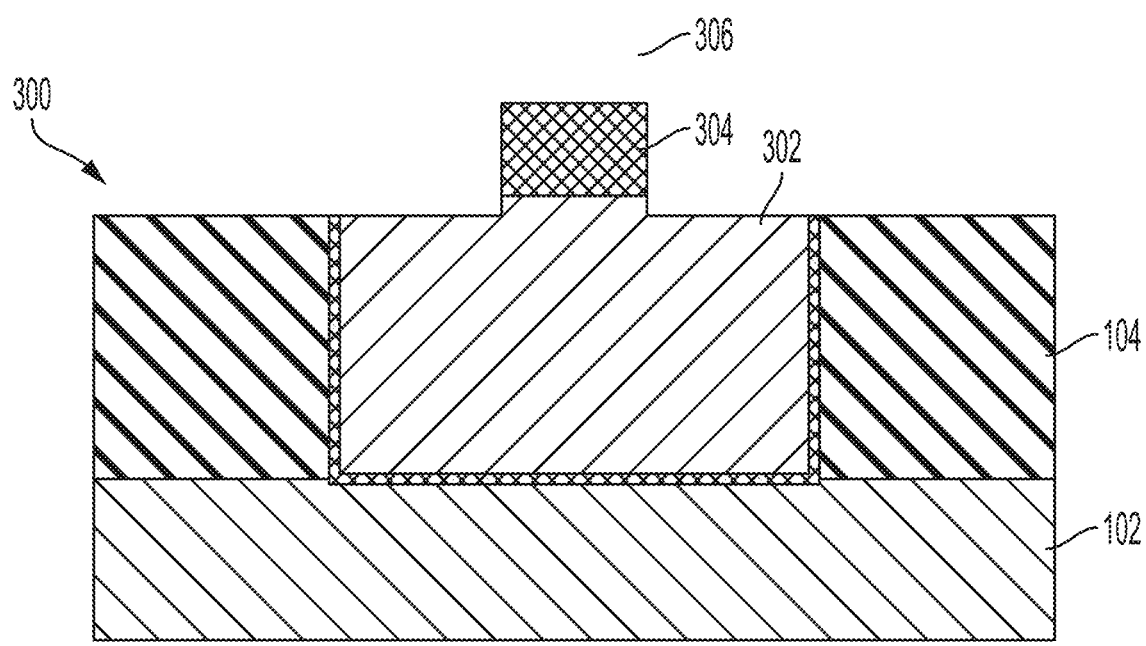
FIG. 13 depicts a cross section of the structure of FIG. 12 subsequent to deposition and patterning of a hard mask layer in accordance with one or more embodiments of the present invention.

In FIG. 13, the via is patterned on top of the patterned line 302 by depositing and lithographically patterning hard mask layers 304 and 306. Hard mask layer 304 is a metal hard mask such as titanium nitride whereas hard mask 306 is a dielectric hard mask as previously described.

Figure 14:
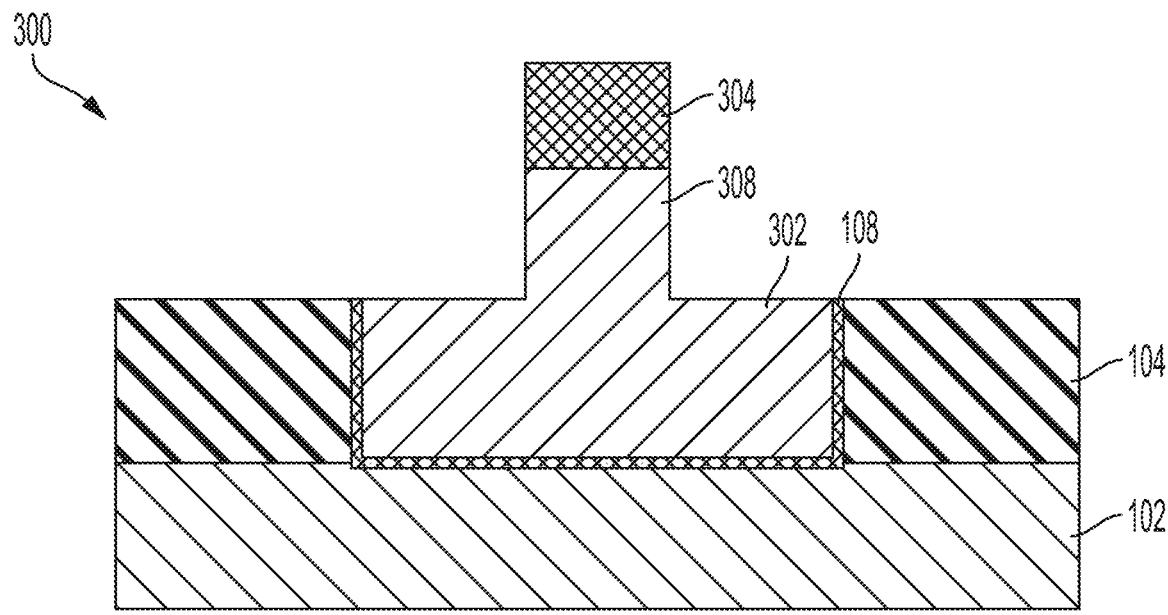
FIG. 14 depicts a cross section of the structure of FIG. 13 subsequent to directional etch of the exposed portions of the substrate to integrally form a pillar on top of the metal line in accordance with one or more embodiments of the present invention.

FIG. 14 depicts the structure 300 of FIG. 13 subsequent to directional etch processing such an ion beam etching, reactive ion etching, and combinations thereof to selectively remove exposed portions of the liner layer 108, the metal filled trench 302, and the dielectric 104. The amount of material removed defines a height of a pillar on top of the line 302, i.e., via 308 self-aligned to the metal line 302. Compared to the structure formed from the previous method and shown in FIG. 7, the current method results in a self-aligned via 308 to underneath line 302 as shown in FIG. 14.

Figure 15:
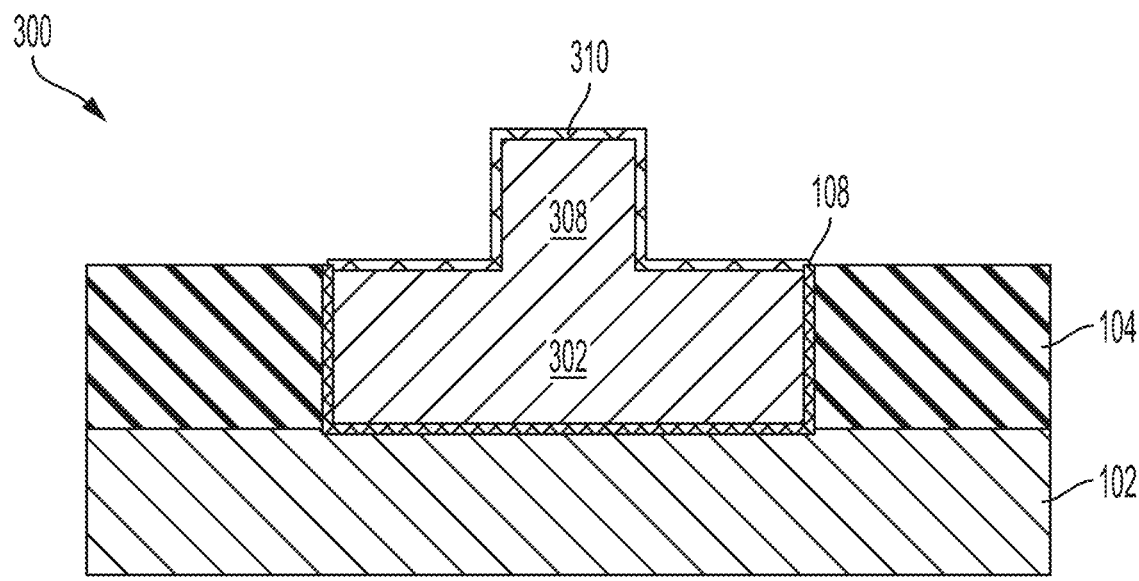
FIG. 15 depicts a cross section of the structure of FIG. 14 subsequent to deposition of a liner layer onto the exposed surfaces of the metal conductor in accordance with one or more embodiments of the present invention.

In FIG. 15, the hard mask 304 is selectively removed by a wet etch process, for example, and a liner layer 310 is then deposited onto the exposed conductor surfaces, i.e., exposed surfaces of the via 308 and the line 302.

The substrate 300 is then processed in a similar manner to that discussed above with respect to FIG. 9 and FIGS. 10-11. That is, with respect to FIG. 9, an interlayer dielectric can be deposited onto the structure, which can be the same or different from the underlying interlayer dielectric as shown therein. In one or more alternative embodiments, the remaining interlayer dielectric is selectively removed as was depicted in FIG. 10 followed by deposition of a second interlayer dielectric at a full thickness, wherein the deposition of the interlayer dielectric is configured to result in pinch off between adjacent top via and line interconnect structures so as to provide air gaps therebetween as was generally depicted in FIG. 11.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A back end of the line process for forming an interconnect structure, the process comprising:
depositing a first interlayer dielectric layer onto a substrate;
lithographically patterning and etching the first interlayer dielectric to form one or more trench openings;
conformally depositing a first liner layer;
depositing a metal into the one or more openings and forming an overburden of the metal having a defined thickness;
depositing a hard mask layer onto the top surface of the overburden;
patterning the hard mask layer to the overburden;
directionally etching exposed portions of the overburden to the interlayer dielectric;
removing the hard mask layer so as to form a pillar of the metal onto the metal filled trench, wherein the pillar defines a via self-aligned to the metal filled trench and at a thickness of about the defined thickness of the overburden; and
conformally depositing a second liner layer onto the exposed surfaces of the pillar and exposed portions of the metal filled trench such that the metal filled trench and via are encapsulated.

2. The back end of the line process for forming an interconnect structure of claim 1, further comprising depositing a second interlayer dielectric onto the substrate.

3. The back end of the line process for forming an interconnect structure of claim 1, wherein the first interlayer dielectric is an ultra low k dielectric having a k value less than about 3.

4. The back end of the line process for forming an interconnect structure of claim 2, wherein the first interlayer dielectric is of a different material than the second interlayer dielectric.

5. The back end of the line process for forming an interconnect structure pf claim 1, wherein the hard mask layer comprises a titanium nitride layer on the overburden and a dielectric layer on the titanium nitride layer.

6. The back end of the line process for forming an interconnect structure of claim 1 further comprising removing the first interlayer dielectric; and depositing a second interlayer dielectric onto the substrate such that an air gap is formed between adjacent metal filled trenches and vias.

7. A back end of the line process for forming an interconnect structure, the process comprising:
depositing a first interlayer dielectric layer onto a substrate;

lithographically patterning and etching the interlayer dielectric to form one or more trench openings;
conformally depositing a first liner layer;
depositing a metal into the one or trench openings to form metal filled trenches and forming an overburden of the metal thereon;
removing the overburden by planarization to the first liner layer;
depositing a hard mask layer onto the substrate;
patterning the hard mask layer;
directionally etching exposed portions of the substrate to define a self-aligned via on top of at least one of the metal filled trenches;
removing the hard mask layer; and
conformally depositing a second liner layer onto the exposed surfaces of the pillar and exposed portions of the metal filled trenches.

8. The back end of the line process for forming an interconnect structure of claim 7 further comprising removing the first interlayer dielectric; and depositing a second interlayer dielectric onto the substrate such that an air gap is formed between adjacent metal filled trenches and vias.

9. The back end of the line process for forming an interconnect structure of claim 7 further comprising depositing a second interlayer dielectric.

10. The back end of the line process for forming an interconnect structure of claim 7, wherein the hard mask layer comprises a titanium nitride layer and removing the hard mask layer comprises a wet etch process.

11. The back end of the line process for forming an interconnect structure of claim 7, wherein the first and second liner layers comprise tantalum, tantalum nitride, cobalt, ruthenium, titanium, titanium nitride, tungsten nitride, or combinations of at least one of the foregoing materials.

12. The back end of the line process for forming an interconnect structure of claim 7, wherein the first interlayer dielectric is an ultra low k dielectric having a k value less than about 3.

13. The back end of the line process for forming an interconnect structure of claim 7, wherein the vias substantially vertical sidewalls.

* * * * *